(12) United States Patent
Cusa

(10) Patent No.: US 6,201,397 B1
(45) Date of Patent: Mar. 13, 2001

(54) DEVICE FOR MEASURING AND DISPLAYING THE OPERATING AUTONOMY OF A STORAGE BATTERY

(76) Inventor: Piergiuseppe Cusa, Via Lago 2, 28010 Nonio (Verbana) (IT)

( * ) Notice: Subject to any disclaimer, the term of this patent is extended or adjusted under 35 U.S.C. 154(b) by 0 days.

(21) Appl. No.: 09/435,097

(22) Filed: Nov. 5, 1999

(30) Foreign Application Priority Data

Dec. 14, 1998 (IT) .............................................. MI98A2676

(51) Int. Cl.⁷ .................................................. G01N 27/416
(52) U.S. Cl. ............................................................ 324/428
(58) Field of Search ..................................... 324/426, 427, 324/428, 433; 320/132, 149, DIG. 21

(56) References Cited

U.S. PATENT DOCUMENTS 5,229,713 * 7/1993 Bullock et al. ...................... 324/142
5,600,229 * 2/1997 Oh ........................................ 324/426

\* cited by examiner

*Primary Examiner*—Edward H. Tso
(74) *Attorney, Agent, or Firm*—Hedman & Costigan, P.C.

(57) ABSTRACT

A device for measuring and displaying the operating autonomy of a storage battery comprises an electric signal sensor for providing an electric signal indicative of the power drained from the battery, an amplifier, an electric signal integrating element, a converter for carrying out an analogic/digital conversion of the electric signal which allows the addition in register of a digital value indicative of the power drained from the battery, and a display, coupled to the battery, for displaying the digital value as an indication of the operating autonomy of the battery.

1 Claim, 1 Drawing Sheet

DEVICE FOR MEASURING AND DISPLAYING THE OPERATING AUTONOMY OF A STORAGE BATTERY

BACKGROUND OF THE INVENTION

The present invention relates to a device for measuring and displaying the operating autonomy of a storage battery.

As is known, cordless portable devices, such as cellular phones, videocameras, power tools and the like, are conventionally power supplied by portable storage batteries.

A problem frequently encountered in the use of the above mentioned devices is that the user must frequently know, within a set tolerance range, the operating autonomy of the device before recharging its storage battery.

A first group of prior devices of the above mentioned type which can provide the above mentioned autonomy information to a user, comprises devices adapted to normally display said information on a displaying scale including a plurality of displaying bars, for example from 3 to 7 bars.

However, in some cases, such a displaying method depends on the skillness of the user, who must associate a time, as measured in hours or minutes, with the displayed bar number.

Depending on the used device, the storage battery autonomy is conventionally determined either by using the battery discharging curve, i.e. by measuring the discharging voltage thereof, or by using counting devices designed for changing their counting rate depending on the electric current circulating therethrough.

In this connection it should be pointed out that, frequently, the adopted displaying scale is of a non-linear type.

Thus a main problem, affecting the mentioned prior art devices, is that prior approaches are sufficiently accurate only in those cases in which the battery supplies a nearly constant current therefore they cannot be used on a cellular phone drawing a quickly changing current.

Further autonomy displaying methods are based on chemical devices, designed for displaying wordings, for example the word "GOOD" at two displaying points on the same device, for example an electric accumulator, the word "GOOD" being displayed as confused letters as the storage accumulator discharges.

A prior display system which has been designed for actually displaying an autonomy time by minutes, has been designed and applied to videocamera Li-ion batteries.

This system, however, has the drawback that the user apparatus must be preset for easily reading this information stored in the battery, and that is the system itself (i.e. the videocamera) which operates to display the remaining or autonomy time in minutes, on a display associated therewith.

Thus the storage battery and device power supplied thereby would constitute an integral article which could not be separated into the two component parts thereof.

Thus, a requirement exists of accurately detecting the autonomy of a storage battery used in a lot of different battery supplied devices.

SUMMARY OF THE INVENTION

Accordingly, the aim of the present invention is to provide a device for measuring and displaying the operating autonomy of a storage battery, which device provides a user with battery autonomy related information in a very accurate and precise manner.

Within the scope of the above mentioned aim, a main object of the present invention is to provide such a device for measuring and displaying the operating autonomy of a storage battery, which can be associated with the battery itself and, accordingly, can be easily separated, from an operating standpoint, from the apparatus power supplied by said battery.

Another object of the present invention is to provide such a display device allowing to digitally display the Stand-By time yet available, depending on the operating autonomy of the storage battery.

Yet another object of the present invention is to provide such a display device allowing to digitally display the available talking minutes, as the battery supplied device is a cellular phone.

According to one aspect of the present invention, the above mentioned aim and objects, as well as yet other objects, which will become more apparent hereinafter, are achieved by a device for measuring and displaying an operating autonomy of a storage battery, comprising generating means for generating an electric signal indicative of a power amount drained from said battery, characterized in that said device further comprises an amplifier and an integrator for said electric signal, a converter for performing an analogic/digital conversion of said electric signal to allow to add, in a register, a digital value indicative of the power amount drained from said battery, and a display, coupled to said battery, for displaying said digital value as an indication of the operating autonomy of said storage battery.

According to a preferred embodiment of the present invention, the inventive device comprises a compensator for compensating the electric signal with respect to the amplifier offset.

Moreover, the mentioned electric signal is measured by evaluating the voltage drop at the ends of a current sensor in a time unit.

According to another preferred embodiment of the present invention, the device comprises a microprocessor, arranged downstream of the amplifier-integrating assembly, in order to add the digital value indicative of the power amount drained from the battery.

According to a further preferred embodiment of the present invention, the display is designed for displaying, in a digital manner, the available stand-by time depending on the operating autonomy of the storage battery.

Alternately, the display is adapted for displaying, as available talking minutes, the operating autonomy of the battery, as the battery supplied device is a cellular phone.

BRIEF DESCRIPTION OF THE DRAWING

Further advantages and characteristics of the present invention will become more apparent hereinafter from the following detailed disclosure, given by way of an illustrative but not limitative example, with reference to the accompanying drawing, where:

The sole FIGURE is a schematic view of the electric circuit included in the device according to the present invention, for measuring and displaying the operating autonomy of a storage battery.

DESCRIPTION OF THE PREFERRED EMBODIMENT

Figure 1:
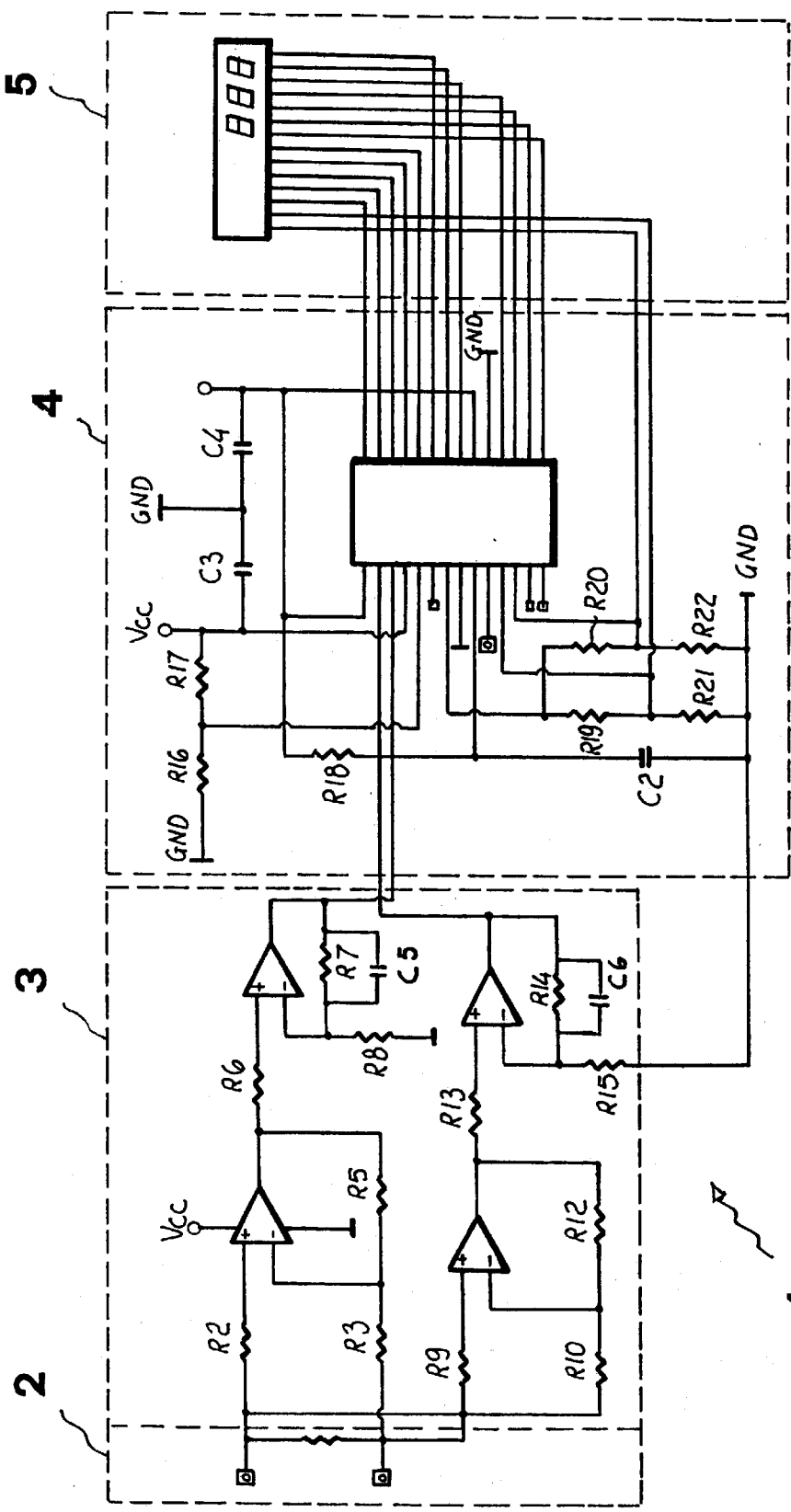

In the following disclosure, reference will be made to a preferred embodiment of the present invention which has been illustrated, by way of an indicative example of several possible variations of the invention.

It should be pointed that the device according to the invention has been specifically designed for association with battery packs to be used on cordless portable apparatus, in particular cellular phones, videocameras, power tools and the like.

More specifically, the subject device has been designed for indicating in a readable form the time (in hours and minutes) of autonomy of a storage battery.

This information can be directly read on the battery pack, independently from the device to which said battery is coupled.

The inventive device, which has been generally indicated by the reference number 1 in FIG. 1, comprises a current sensor 2 for generating an electric signal indicative of the power amount drained from the storage battery.

The current sensor 2, in particular, is coupled to or associated with the storage battery the accumulated or drained power amount of which must be measured.

This power amount will be measured by evaluating the voltage drop at the ends of the current sensor 2 in a time unit, according to the ohm's law:

$$ [A] = V[V]/R[\Omega] $$

The device 1 further comprises an amplifier and integrating assembly 3 for processing the electric signal coming from the current sensor 2.

The device 1 further comprises an A/D converter for providing an analogic/digital conversion of the above mentioned electric signal, and a microprocessor 4.

Downstream of the microprocessor 4 a display 5 is provided, for displaying a digital value, derived from the above mentioned electric signal processing, as indicative of the operating autonomy of the storage battery.

In order to better understand the operation of the inventive device 1, it would be advantageous to consider some experimental results derived from several experiments carried out by the Applicant.

In particular, the accumulated or drained battery power amount would be measured by evaluating a voltage drop at the ends of the current sensor 2 in a time unit, according to the ohm's law:

$$ [A] = V[V]/R[\Omega] $$

In a case in which the device 1 is applied to a cellular phone, the current drained by the cellular phone will change remarkably in the time and being characterized by a comparatively wide dynamic range; in fact, this range varies from few mA's in a stand-by mode of operation, to peaks of several A's in a transmission mode of operation, the duration of the current peaks being of the order of $\mu$S.

Since the device 1 must not greatly deteriorate the power capability of the storage battery, it would not be possible to use measurement and conversion complex and fast operating systems, and, accordingly, a statistic measurement derived from an integration of the input signal will be used.

The input signal, as measured at the ends of the current sensor 2, is at first amplified and then compensated for with respect to the amplifier offset, and finally integrated, by using the amplifier-integrating assembly 3.

Downstream of the integrator an analogic/digital (A/D) conversion is performed, in which, since the time constant of the integrator is greater than the sampling period, a step arrangement of the measurement amount will be obtained, the width step being established by the sampling operation of the microprocessor 4.

In this connection it should pointed out that, because of the requirement of bringing to a minimum the power drained by the measuring circuit, the microprocessor 4 will be set to normally operate in a sleep mode, thereby draining few $\mu$A's, and being cyclically energized, for example with a rate of 1 sec., in order to perform the measurement and A/D conversion operation; in this connection it should be moreover pointed out that the front end will be supplied only for the time required for performing the measurement.

After having carried out A/D conversion and related mathematical processing, the obtained data will be sent to the display device 5 (for example a LCD display) provided on the same circuit.

The measured, integrated and converted current value will be added, for each time slot, with its set sign in a register which can be defined as a "Token" tank.

This power amount will be converted to stand-by hours or talking means, by carrying out a plurality of divisions by previously known constant values, as experimentally determined, in the case of the cellular phones.

In the videocamera or power tool storage batteries, this problem does not exist, since these devices have a sufficiently constant current draining.

Since the minimum voltage value through which a battery is considered as discharged is a known value, it would be easily to know the time at which the power supplied device would not be able of further operating.

At this time, if the "token" tank has a value different from zero, than a recalibrating mechanism is energized, so as to modify,, in subsequent cycles, the maximum value which could be achieved, thereby equilibrating the prevision with the actual power availability property.

Other parameters will affect the tank storing capabilities, in particular the operating temperature, as measured by a temperature sensor, and the performed cycle number.

From the above disclosure it should be apparent that the invention fully achieves the intended aim and objects.

What is claimed is:

1. A device for measuring and displaying an operating autonomy of a storage battery, said device comprising generating means for generating an electric signal indicative of a power amount drained from said battery, an amplifier and an integrator for said electric signal, a converter for performing an analogic/digital conversion of said electric signal to allow to add, in a register, a digital value indicative of a power amount drained from said battery, and a display, coupled to said battery, for displaying said digital value as an indication of the operating autonomy of said storage battery, and a compensator for compensating for said electric signal with respect to an offset of said amplifier.

* * * * *